United States Patent [19]
Matsumoto et al.

[11] Patent Number: 6,049,659
[45] Date of Patent: *Apr. 11, 2000

[54] METHOD FOR AUTOMATICALLY DESIGNING A SEMICONDUCTOR INTEGRATED CIRCUIT

[75] Inventors: Noriko Matsumoto, Kyoto; Seiji Tokunoh, Osaka, both of Japan

[73] Assignee: Matsushita Electric Industrial Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/773,751

[22] Filed: Dec. 24, 1996

[30] Foreign Application Priority Data

Dec. 26, 1995 [JP] Japan .................................. 7-339173
Mar. 21, 1996 [JP] Japan .................................. 8-064387

[51] Int. Cl.[7] ........................................... G06F 15/60
[52] U.S. Cl. ....................................... 395/500.02
[58] Field of Search ................... 364/488, 489, 364/490, 491

[56] References Cited

U.S. PATENT DOCUMENTS 5,231,590 7/1993 Kumar et al. ........................ 364/491
5,586,047 12/1996 Imahashi .............................. 364/491
5,592,392 1/1997 Matheson et al. .................... 364/490

FOREIGN PATENT DOCUMENTS 2-48774 2/1990 Japan .
3-41561 2/1991 Japan .

Primary Examiner—Kevin J. Teska
Assistant Examiner—Thuan Do
Attorney, Agent, or Firm—McDermott, Will & Emery

[57] ABSTRACT

Layout data about a core part of a predesigned microcontroller such as a CPU block obtained by custom layout design, and logical data about a peripheral part of the microcontroller are read out from a library of components. These layout and logical data are reused for the layout design of a new microcontroller. The peripheral part logical data is modified according to circuit information about the new microcontroller. Layout data about a peripheral part of the new microcontroller is generated by an automatic placement/wire routing tool from the modified logical data. The core part layout data is simply reused as is for a core part of the new microcontroller. Layout data about the entire new microcontroller is generated by a block-to-block automatic placement/wire routing tool from layout data about individual circuit blocks.

13 Claims, 17 Drawing Sheets

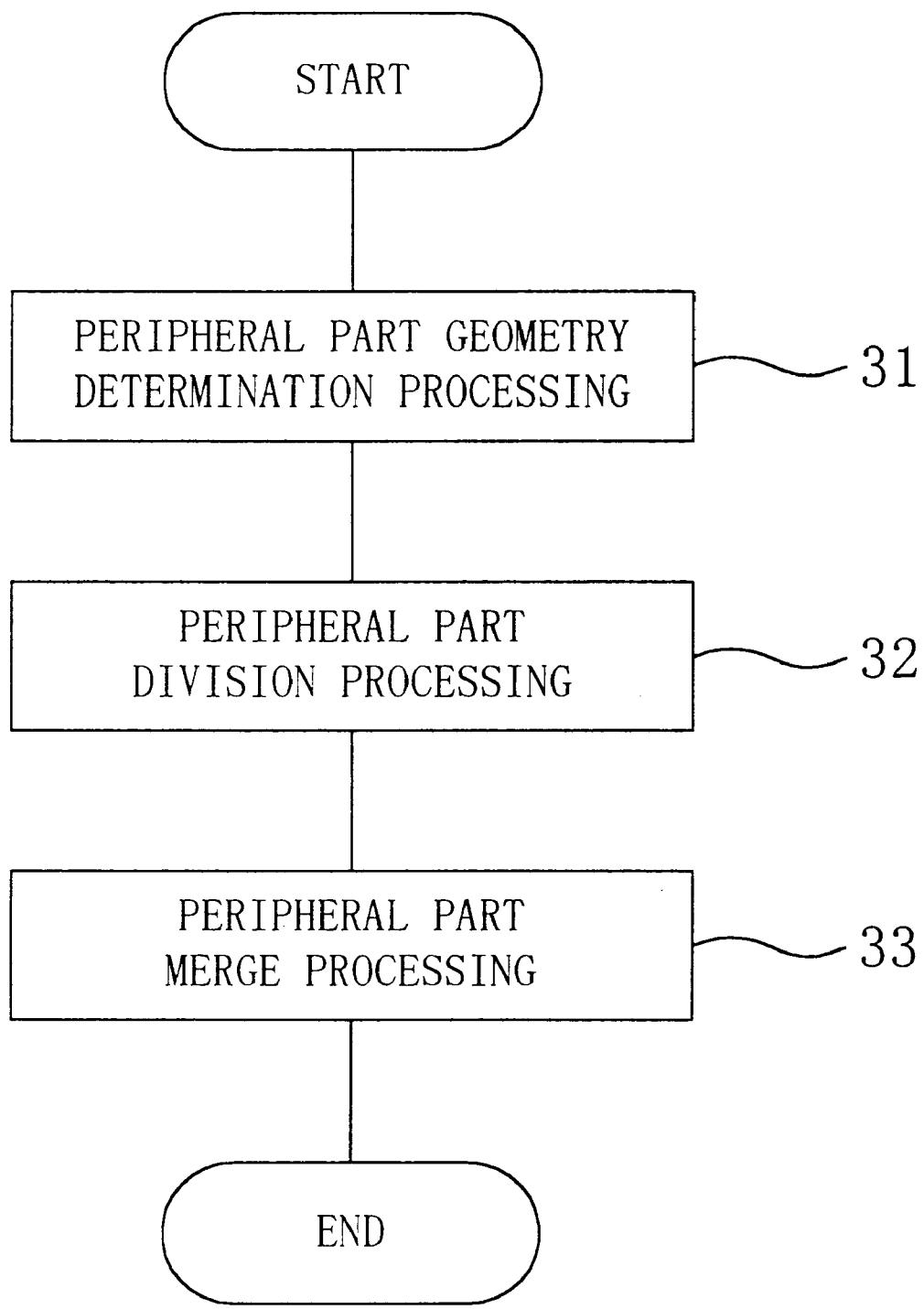

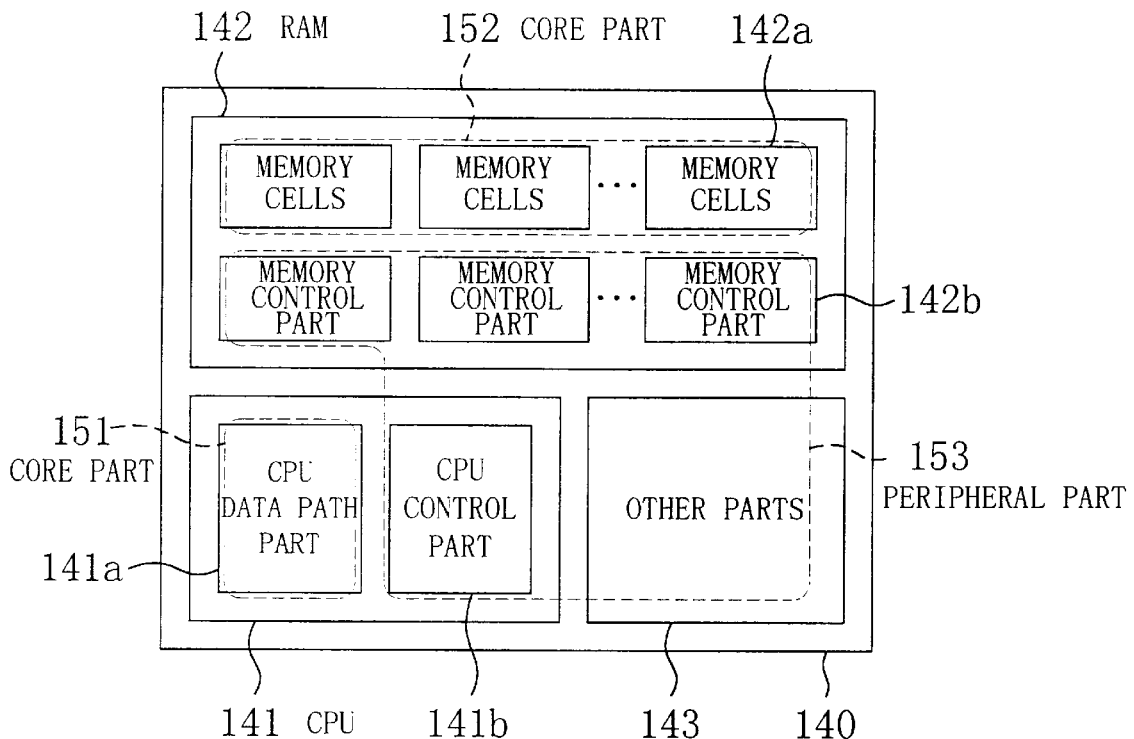
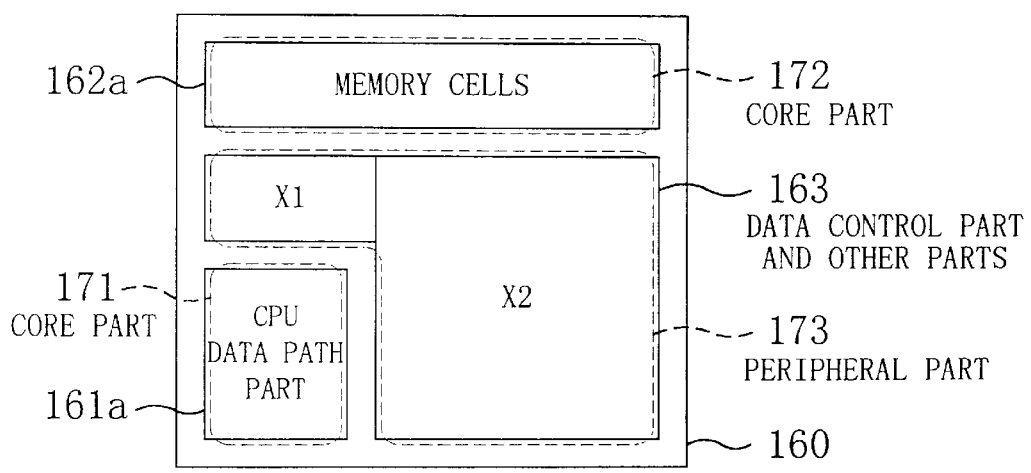

FIG. 11A — LSI0:
· CIRCUIT DATA D: CPU+FPU0+ULC0 — 231

FIG. 11B — CPU:
· CIRCUIT DATA B1: f1, f2, f3, f4, f5, f6, f7 — 232

FIG. 11C — FPU0:
· CIRCUIT DATA B20: f1, f2, f3, f4 — 233

FIG. 11D — FPU1:
· CIRCUIT DATA B21: f1, g2, f3, g4 — 234

FIG. 11E — FPU2:
· CIRCUIT DATA B22: f1, f2, g3 — 235

FIG. 11F — ULC0:
· CIRCUIT DATA B30: f4, f5, f6, f7 — 236

FIG. 11G — ULC1:
· CIRCUIT DATA B31: g4, f5, g6, f7 — 237

FIG. 11H — ULC2:
· CIRCUIT DATA B32: f4, f5, f6, g7 — 238

FIG. 13A

```
FPU1 :

· CIRCUIT DATA B21: f1, g2, f3, g4

· CPU MODIFICATION PROCEDURE INFORMATION
        E21:  add g2
              add g4
              delete f2
              delete f4
```
—251

FIG. 13B

```
ULC1 :

· CIRCUIT DATA B31: g4, f5, g6, f7

· CPU MODIFICATION PROCEDURE INFORMATION
        E31:  add g4
              add g6
              delete f4
              delete f6
```
—252

FIG. 15A

```
FPU2 :

· CIRCUIT DATA B22: f1, f2, g3

· CPU MODIFICATION PROCEDURE INFORMATION
      E22: add g3
           delete f3
           delete f4
```
~271

FIG. 15B

```
ULC2 :

· CIRCUIT DATA B32: f4, f5, f6, g7

· CPU MODIFICATION PROCEDURE INFORMATION
      E32: add g7
           delete f7
```
~272

FIG. 17

```
LSI3 :

· CPU MODIFICATION PROCEDURE INFORMATION
        G3:  add g2
             add g4
             add g7
             delete f2
             delete f7
```
~291

FIG. 19

```
ULC1 :

· CPU MODIFICATION PROCEDURE INFORMATION
     200  add_pin g6
     201  delete_pin f4
           ········
```
~295

FIG. 18

```
100 copy_pin f6[10,20] to [10,30]
101 rename_pin f6[10,30] to g6
102 move_pin f4[10,40] to [10,50]
103 rename_pin f4[10,50] to g4
104 remove_pin g4[10,50]
    . . . . . . . . .
```

293

METHOD FOR AUTOMATICALLY DESIGNING A SEMICONDUCTOR INTEGRATED CIRCUIT

BACKGROUND OF THE INVENTION

The present invention relates to a method for automatically designing semiconductor integrated circuits, and in particular to a method for the design of large-scale integrated circuits (LSI).

Typical LSI design processing is divided into three design steps, namely the design of function, the design of logic and the design of layout. In the function design step, a functional specification is created by a hardware description language such as Verilog-HDL and VHDL or by paperwork. In the logic design step, logical data is generated from functional data describing the functional specification. The logical data is represented in the form of a netlist or in the form of a circuit diagram. In the layout design step, layout data is generated from the logical data. The layout data represents an actual mask layout. Each of these design steps has been automated with the aid of CAD tools or performed by manpower.

In the layout design of LSIs such as microcontrollers and microprocessors a design style, in which peripheral circuit blocks including floating point arithmetic units (FPUs) and user logic circuits (ULCs) are combined around a circuit block of a central processing unit (CPU) serving as a core, has been considered a practical design style. Such a ULC is a circuit block for the customization of LSI. Either custom layout design work by manpower or layout design work by automatic placement/wire routing tool is selected from the view points of, for example, required performance, cost and number of development steps for each circuit block. Custom layout design is adopted, especially for high-speed circuit blocks, to make it possible to use dedicated cells as well as to make the most of special circuit configurations, and layout editors or the like are prepared for the custom layout design. Layout design by automatic placement/wire routing tool using standard cells and gate arrays, is adopted for other circuit blocks. After all circuit blocks of the LSI are layout designed, the assembling of the circuit blocks is executed by block-to-block automatic placement/wire routing tool.

For the realization of high-efficiency LSI automated design, a technique has been proposed recently in which circuit data about individual components of each LSI which had been designed before (herein after called the predesigned LSI) are accumulated as design resources (assets) for future use. This technique is called the "resource reusing design". The circuit data is the data which includes functional data, logical data and layout data. For instance, a microcontroller LSI comprises a CPU as a core component and a plurality of peripheral components such as FPUs and ULCs. Every time a design of one microcontroller LSI is produced, circuit data about individual components of the LSI are entered into a library. Where a new LSI is a combination of preentered (already-stored) circuit components, circuit data about these preentered circuit components stored in the library are reused.

The above-described technique, however, has the problem that, even if fixed layout data about individual circuit blocks of a predesigned LSI are stored in the library for future use, these layout data are most unlikely to be used effectively when a new LSI greatly differs from the predesigned LSI in entire geometric form and in circuit block placement. In other words, there have been no means capable of utilizing results of the custom layout design produced by human designers.

If the internal module configuration and terminal placement of a core component is determined so that the core component can be connected with all peripheral components thereof, the core component then becomes redundant. One reason for the redundancy problem is that there are cases in which certain internal modules and terminals of a CPU necessary for one FPU are not needed by another FPU. In order to cope with such a situation, a method has been employed in which the internal module configuration and terminal placement of a core component is determined such that the core component can be connected with a specific group of peripheral components and circuit data about the core component is entered into the library. Therefore, even when a new LSI is a combination of preentered components, it is most likely to occur that the circuit data of the core component must be modified. If every modified circuit data is stored as a design resource, this requires a mass storage library. For this reason, conventionally, results of the modification of core component circuit data are not stored.

SUMMARY OF THE INVENTION

It is an object of the present invention to improve the reusability of design resources so as to provide a high-efficiency LSI layout design method.

It is another object of the present invention to make, in automated design of an LSI made up of at least one core component and a plurality of peripheral components, results concerning the modification of core component circuit data reusable by means of a small-storage library.

For example, in accordance with the present invention, both layout data about a core part of an already-designed (predesigned) LSI and logical data about a peripheral part of the predesigned LSI are reused in the design of a new LSI. In a microcontroller, a CPU and other peripheral circuit blocks can be dealt with as a core part and as a peripheral part, respectively. The logical data about the peripheral part of the predesigned LSI is modified according to the circuit information about an entire geometric form of the new LSI and a placement of circuit blocks of the new LSI. Thereafter, layout data about a peripheral part of the new LSI is generated from the modified logical data by an automatic placement/wire routing tool or the like. The layout data about the core part of the predesigned LSI is simply reused as is or is partially modified and thereafter is reused as layout data about a core part of the new LSI. After layout data about all circuit blocks of the new LSI are obtained, the assembling of the circuit blocks is performed using a block-to-block automatic placement/wire routing tool or the like, in order to generate layout data about the entire new LSI. One advantage of this method is that layout design of a peripheral part is reexecuted according to the circuit information while making utilization of the result of custom layout design of a core part, thereby making it possible to deal with changes in a floor plan such as partial changes in circuit function and changes in circuit block geometric form, with high flexibility. In addition, high layout design quality is guaranteed.

According to another method of the present invention, every time design of one LSI is completed modification procedure information is extracted which describes a procedure of modification processing which has been performed on circuit data about a core component of the LSI for the connecting of individual peripheral components with the core component and the extracted modification procedure information is entered into a library. When a new LSI is a combination of preentered circuit components, circuit data and modification procedure information of these preentered circuit components stored in the library are reused. In such a case, new modification procedure information for peripheral components-to-core component connection can be generated by merging the aforesaid modification procedure information pieces read out from the library together with circuit data about the individual peripheral components. According to the present method, there is no need for reserving modified circuit data about the core component as they are, whereby the library becomes compact in storage capacity. If it is arranged such that core component modification procedure information for each peripheral component is stored in the library, this makes it possible for a plurality of designers to concurrently perform their respective core component modification work.

BRIEF DESCRIPTION OF THE DRAWINGS

FIG. 2 is a flow diagram showing the operation of a peripheral part division/merge unit of FIG. 1.

FIG. 7A shows an example of a predesigned LSI and FIG. 7B shows an example of a new LSI generated by resource reusing design.

FIGS. 11A–H show examples of circuit components entered into a circuit component storage unit of FIG. 9.

FIGS. 13A and 13B show examples of modification procedure information stored for each peripheral component in the circuit component storage unit of FIG. 9 at the time of designing the LSI of FIG. 12.

FIGS. 15A and 15B show examples of modification procedure information stored for each peripheral component in the circuit component storage unit of FIG. 9 at the time of designing the LSI of FIG. 14.

FIG. 17 shows an example of merged modification procedure information obtained in a modification procedure merge unit of FIG. 9 at the time of designing the LSI of FIG. 16.

FIG. 18 shows an example of an operation history in a circuit design processing unit of FIG. 9.

FIG. 19 shows modification procedure information extracted by a modification procedure extraction unit of FIG. 9 from the operation history example of FIG. 18.

DETAILED DESCRIPTION OF THE INVENTION

With reference to the accompanying drawings, embodiments of the resource reusing design in accordance with the present invention are now described below.

Figure 1:
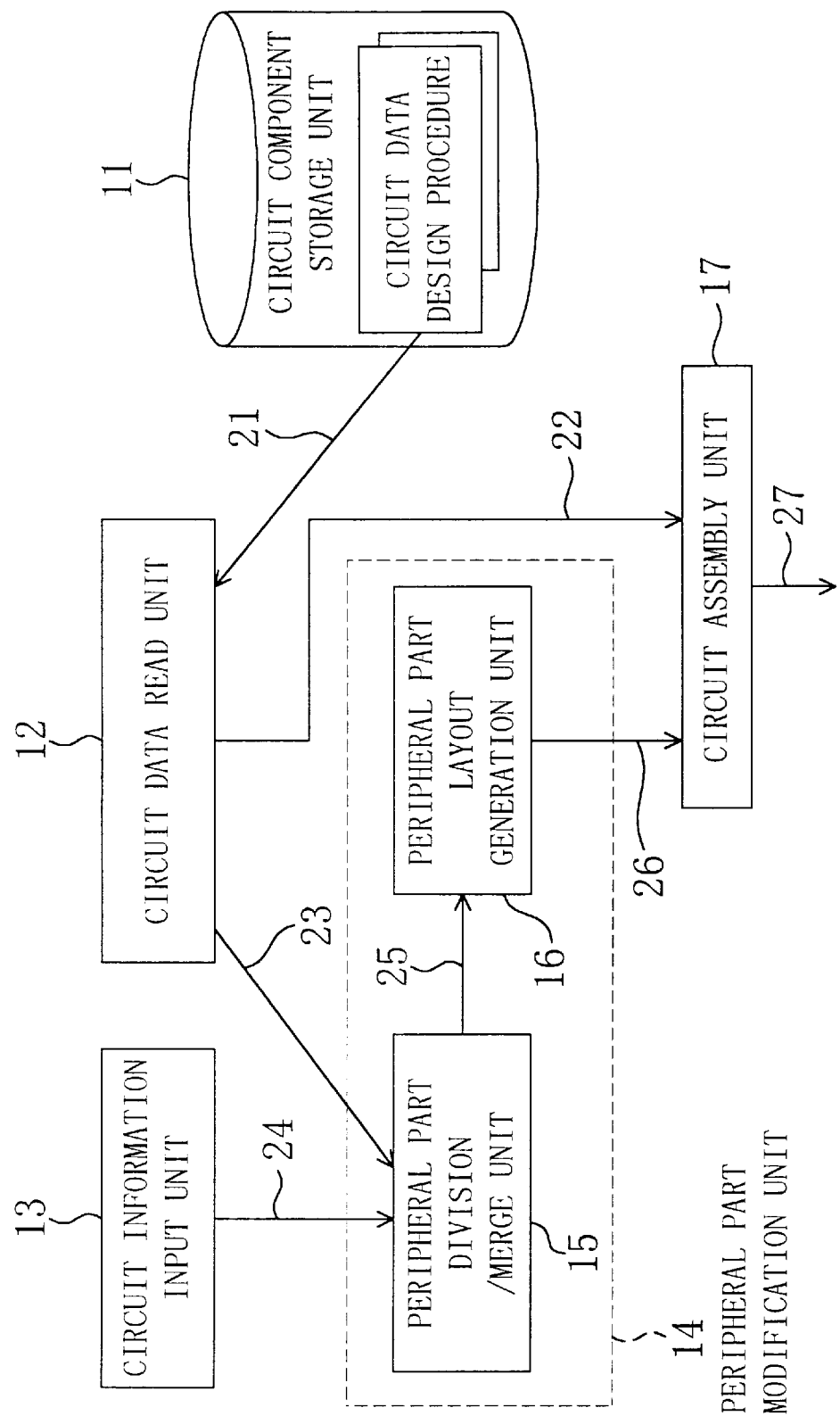
FIG. 1 shows in block form an example of an LSI automated design system for the realization of resource reusing design in accordance with the present invention.

FIG. 1 illustrates an example of the structure of an LSI automated design system of the present invention for the realization of resource reusing design. 11 is a circuit component storage unit (CCSU), or a library. The CCSU 11 batch-stores, for each of circuit components forming a predesigned LSI, (a) circuit data about a circuit component, (b) a design procedure applied to the circuit component and (c) information about, for example, the performance and area of the circuit component. Each circuit data includes functional data obtained in a functional design step, logical data obtained in a logic design step and layout data obtained in a layout design step. The circuit components include a CPU as a core component and a plurality of peripheral components such as FPUs and ULCs. 12 is a circuit data read unit (CDRU). The CDRU 12 reads, from the CCSU 11, CIRCUIT DATA 21 necessary for the formation of a new LSI. The new LSI is formed of a core part of a CPU block and a peripheral part comprising a plurality of circuit blocks other than the CPU block. CIRCUIT DATA 21 from the CCSU 11 contains LAYOUT DATA 22 about the core part and LOGICAL DATA 23 about the peripheral part both necessary for the new LSI. 13 is a circuit information input unit (CIIU). The CIIU 13 inputs CIRCUIT INFORMATION 24 about an entire geometric form of the new LSI and a placement of circuit blocks in the entire geometry of the new LSI. LOGICAL DATA 23 about the peripheral part necessary for the new LSI ant CIRCUIT INFO 24 are fed to a peripheral part modification unit (PPMU) 14. The PPMU 14 is made up of (a) a peripheral part division/merge unit (PPDMU) 15 which performs modification (division/merge) on LOGICAL DATA 23 about the peripheral part according to CIRCUIT INFO 24 and (b) a peripheral part layout generation unit (PPLGU) 16 which generates, from LOGICAL DATA 25 modified, LAYOUT DATA 26 about the peripheral part of the new LSI by automatic placement/wire routing tool. LAYOUT DATA 26 (i.e., the peripheral part layout data generated by the PPLGU 16) and LAYOUT DATA 22 (the core part layout data provided from the CDRU 12) are fed to a circuit assembly unit (CAU) 17. Layout data 27 about the entire new LSI is generated in the CAU 17 by means of block-to-block automatic placement/wire routing tool.

FIG. 2 shows the operation of the PPDMU 15. In a step 31 which is a peripheral part geometry determination process, the geometric form of the peripheral of the new LSI is determined according to CIRCUIT INFO 24 of the new LSI. The geometric form of the peripheral part of the new LSI is, for example, L-shaped. In a step 32 which is a peripheral part division process, the peripheral part of the new LSI is divided into a plurality of rectangular blocks and each of the rectangular blocks is assigned a respective peripheral circuit block. In a step 33 which is a peripheral part merge process, a plurality of circuit blocks of the peripheral part are merged such that they enter into one rectangular block.

Figure 3A:
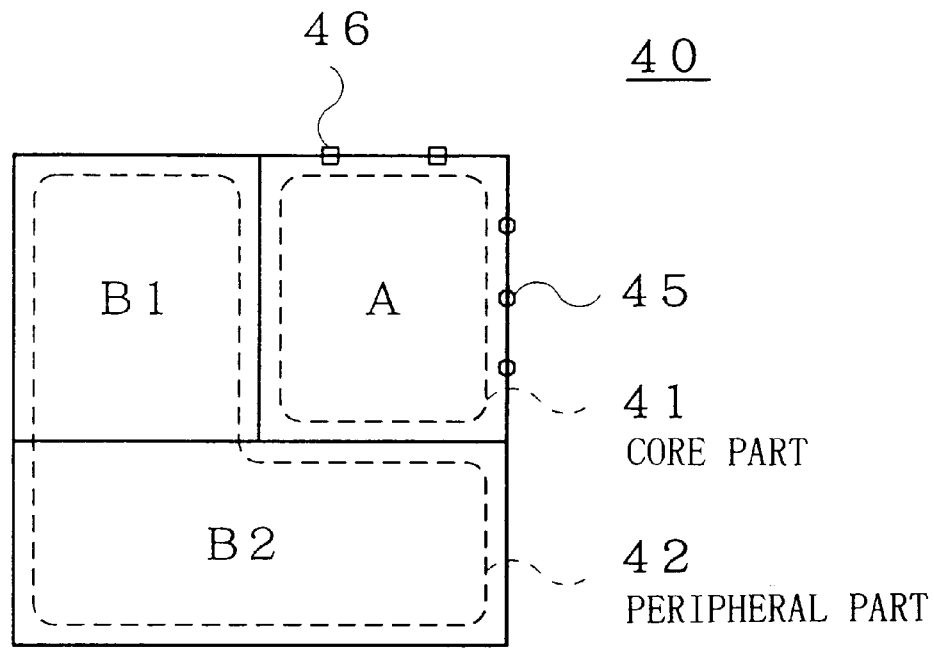
FIG. 3A illustrates an example of a predesigned LSI and FIG. 3B illustrates an example of a new LSI generated by resource reusing design.
Figure 3B:
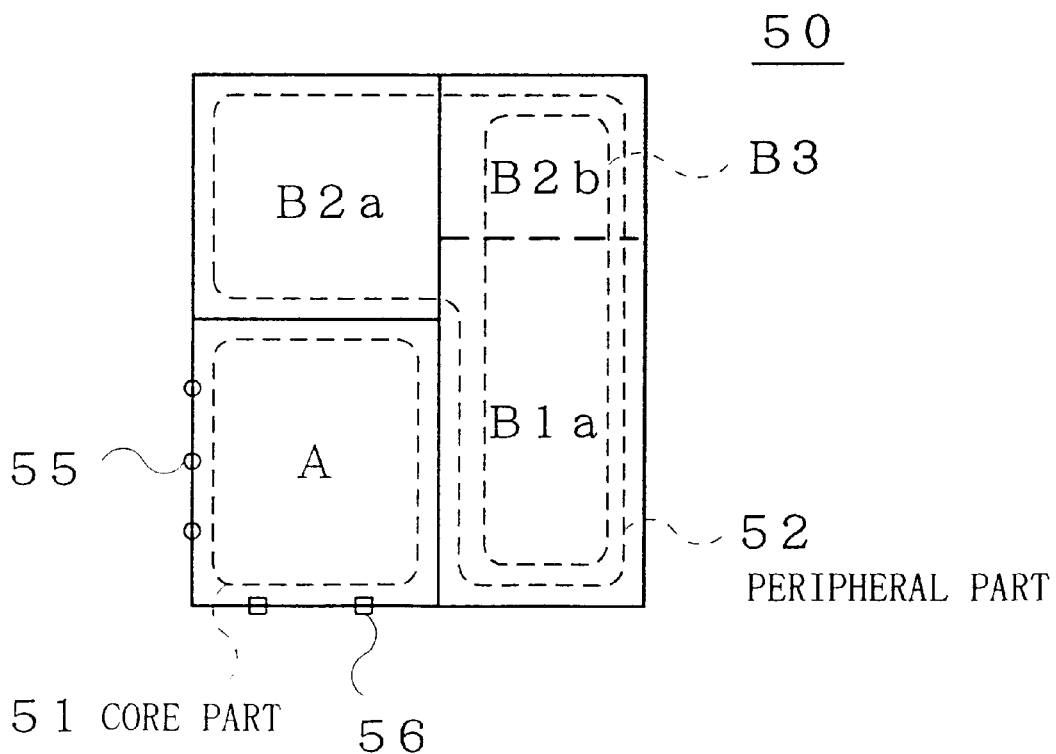

FIG. 3A illustrates an example of a predesigned LSI. FIG. 3B illustrates an example of a new LSI obtained by resource reusing design. A predesigned LSI 40 of FIG. 3A is made up of three circuit blocks A, B1 and B2. Suppose here that layout data about the circuit block A is obtained by custom layout design performed by manpower and layout data about the circuit blocks B1 and B2 are obtained by layout design by means of automatic placement/wire routing tool. The circuit block A forms a core part 41. The circuit blocks B1 and B2 together form a peripheral part 42. The circuit block A, which forms the core part 41, is provided, on two sides of the external form of the LSI 40, with terminals 45 and 46 for establishing connections with the outside. The layout data about the circuit block A and the logical data about the circuit blocks B1 and B2 are reused to layout design a new LSI 50 shown in FIG. 3B. Note that the predesigned LSI 40 and the new LSI 50 differ from each other in geometric form. The layout data about the core part 41 of the predesigned LSI 40, i.e., the layout data about the circuit block A, is simply reused as is or is partly modified and thereafter is reused as layout data about a core part 51 of the new LSI 50. The circuit block A, which forms the core part 51, is provided, on two sides of the external form of the new LSI 50, with terminals 55 and 56 for establishing connections with the outside. Of the logical data about the peripheral part 42 of the predesigned LSI 40, logical data about the circuit block B1 is used to layout design a circuit block B1a of FIG. 3B. Of the logical data about the peripheral part 42 of the predesigned LSI 40, logical data about the circuit block B2 is divided into two portions and used to layout design two circuit blocks B2a and B2b of FIG. 3B, respectively. The logical data about the circuit block B1a and the logical data about the circuit block B2b are merged and the merged logical data is used to layout design a circuit block B3. Thereafter, the two circuit blocks B2a and B3, which together form the peripheral part 52 of the new LSI 50, are layout designed by means of automatic placement/wire routing tool. When layout data about the circuit blocks A, B2a and B3 of the new LSI 50 are obtained, the assembly of the circuit blocks A, B2a and B3 is executed by block-to-block automatic placement/wire routing tool.

The peripheral part division/merge processing (see FIGS. 3A and 3B) is described in detail. The L-shaped peripheral part 52 of the new LSI 50 is first divided into two rectangular blocks, namely a left-hand side rectangular block and a right-hand side rectangular block. The circuit block B1 of FIG. 3A is able to enter into the right-hand side rectangular block as it is. Therefore, the circuit block B1 is placed in the right-hand side rectangular block. On the other hand, the circuit block B2 of FIG. 3A is unable to enter into the left-hand side rectangular block or the remaining part of the right-hand side rectangular block unless it is modified. Therefore the circuit block B2 is divided into two portions. Note that what is meant by "to enter into a block as it is" includes cases where the use of automatic placement/wire routing tool allows a block, which is unable to enter into any block unless modified, to have an enterable geometry. Further, the two circuit blocks B1a and B2b, contained in the right-hand side rectangular block, are merged into a single circuit block (the circuit block B3). These division/merge processing operations in series may be done by a commercially available floor planer.

Figure 4A:
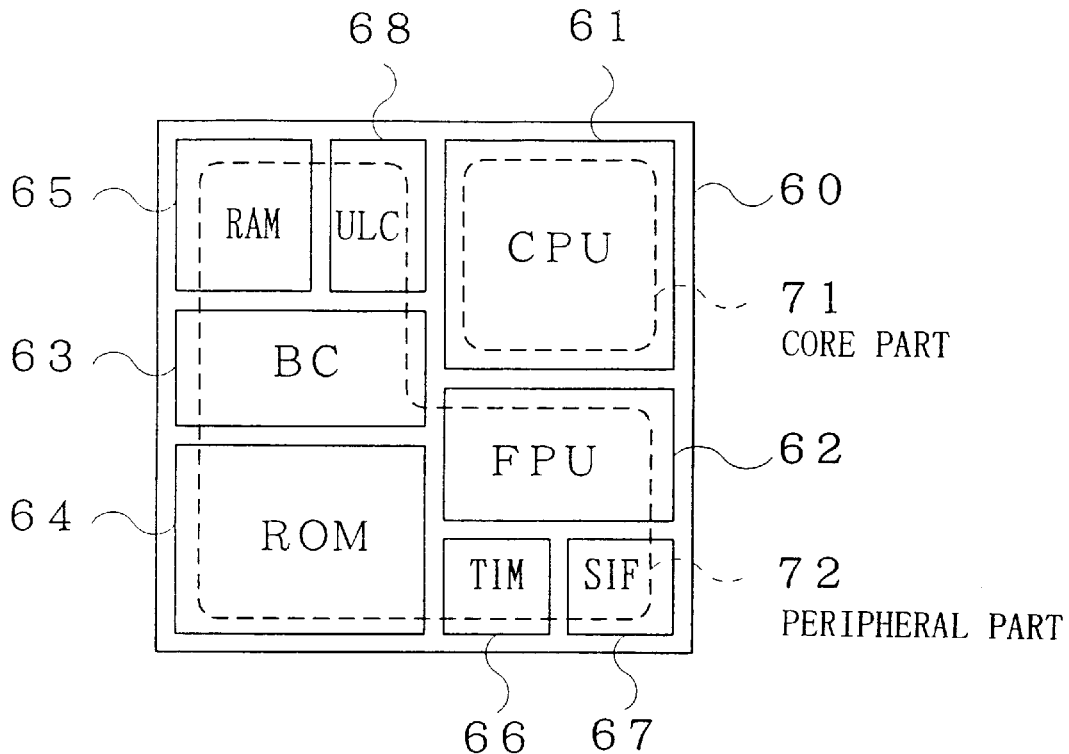
FIG. 4A illustrates another example of a predesigned LSI and FIG. 4B illustrates another example of a new LSI generated by resource reusing design.
Figure 4B:
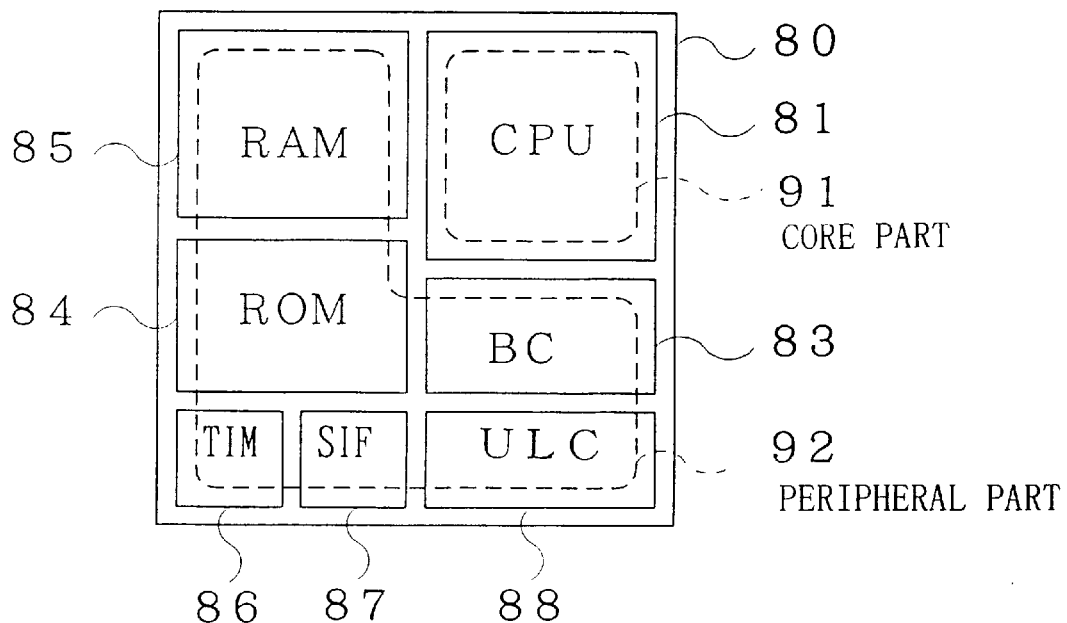

FIG. 4A illustrates an example of a predesigned microcontroller. FIG. 4B illustrates an example of a new microcontroller generated by resource reusing design. A predesigned microcontroller 60, shown in FIG. 4A, comprises eight circuit blocks. These eight circuit blocks are a CPU (central processing unit) 61, an FPU (floating point arithmetic unit) 62, a BC (bus controller) 63, a ROM (read only memory) 64, a RAM (random access memory) 65, a TIM (timer) 66, an SIF (serial interface) 67, a ULC (user logic circuit) 68. A new microcontroller 80, shown in FIG. 4B, is layout designed in which (a) the CPU block 61 of the predesigned microcontroller 60 is the core part 71 of the new microcontroller 80, (b) the remaining seven (circuit blocks 62–68 of the predesigned microcontroller 60 are the peripheral part 72 of the new microcontroller 80, (c) both the storage capacity of the ROM block 64 and the storage capacity of the RAM block 65 are changed and (d) the provision of the FPU block 62 is omitted. The layout data about the core part 71 of the microcontroller 60 (i.e., the layout data about the CPU block 61) is reused as is, as layout data about a CPU block 81 forming a core part 91 of the new microcontroller 80. Logical data about the respective blocks of the peripheral part 72 of the predesigned microcontroller 60 (the BC 63, the ROM 64, the RAM 65, the TIM 66, the SIF 67 and the ULC 68) are used to layout design their respective corresponding blocks together forming a peripheral part 92 of the new microcontroller 80 (i.e., a BC 83, a ROM 84, a RAM 85, a TIM 86, an SIF 87 and a ULC 88). Thereafter, the assembling of the respective layout data about the seven circuit blocks 81 and 83–88 generates layout data about the entire new microcontroller 80 which is slightly smaller in size than the predesigned microcontroller 60.

Figure 5:
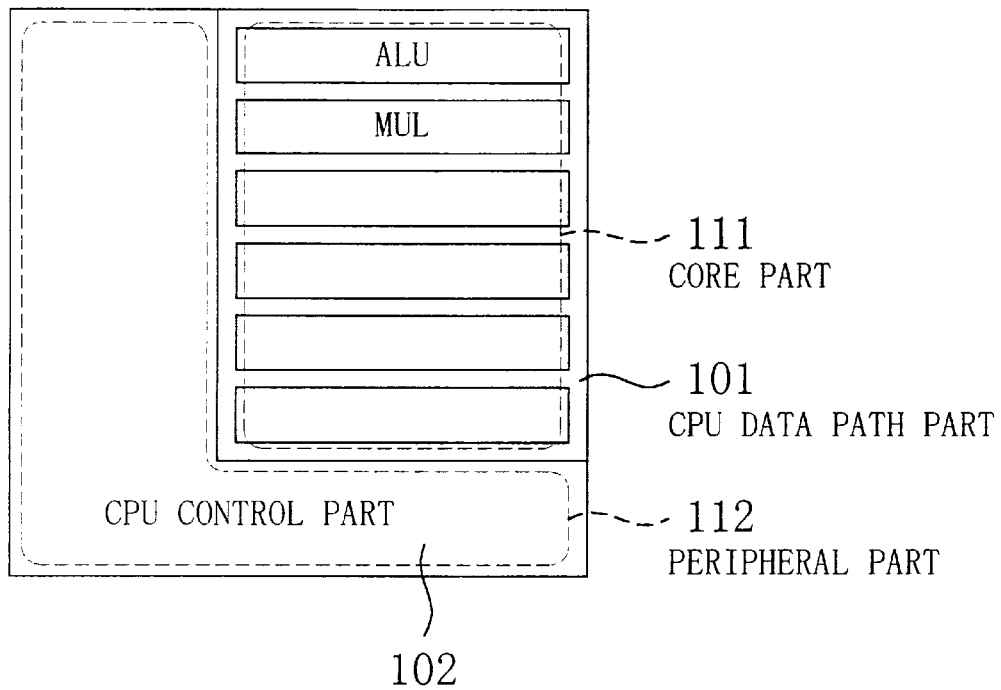
FIG. 5 is a diagram showing in detail an example of the internal structure of a CPU block of FIG. 4A.

FIG. 5 explains in detail an example of the internal structure of the CPU block 61 of FIG. 4A. The CPU block 61 is made up of a CPU data path part 101 including a plurality of functional blocks such an ALU (arithmetic logic unit), an MUL (multiplication unit), registers and shifters, and a CPU control part 102 which controls the operation of the functional blocks. Whereas layout data about the CPU data path part 101 is obtained by custom layout design by manpower, layout data about the CPU control part 102 is obtained by layout design by means of automatic placement/wire routing tool. In this case, a new CPU block can be layout designed by resource reusing design in which the CPU data path part 101 is a core part 111 of the predesigned CPU block and the CPU control part 102 is a peripheral part 112 of the predesigned CPU block. The layout data about the CPU data path part 101 and the logical data about the CPU control part 102 are used to layout design the new CPU block. The geometric form of CPU block can be changed with flexibility.

Figure 6:
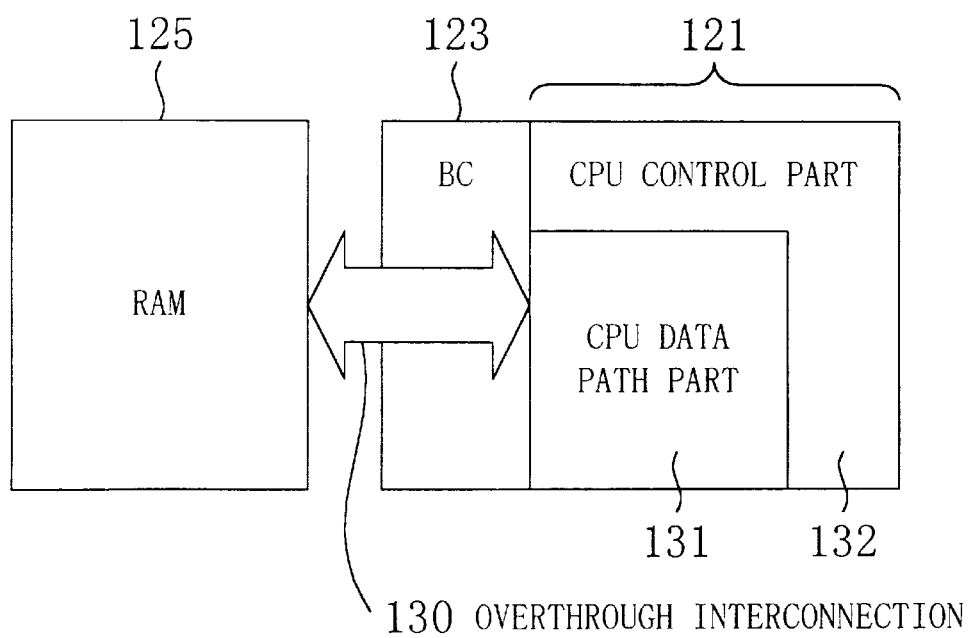
FIG. 6 illustrates still another example of a new LSI generated by resource reusing design.

FIG. 6 shows another example of a new microcontroller generated by resource reusing design. The microcontroller of FIG. 6 has a CPU block 121, a BC (bus controller) block 123 and a RAM block 125. Other blocks, contained in the microcontroller of FIG. 6, are not shown in the figure. The CPU block 121 is made up of a CPU data path part 131 and a CPU control part 132. Layout data about the CPU data path part 131 is obtained by simply reusing the layout data about the CPU data path part 101 of the predesigned CPU block 61 (see FIG. 5) generated by custom layout design. The CPU control part 132 is a result generated front the logical data about the CPU control part 102 of the predesigned CPU block 61 by three-layer layout design by means of automatic placement/wire routing tool. The BC block 123 is generated from the logical data about the BC block 63 of the predesigned microcontroller 60 (see FIG. 4A) by two-layer layout design by means of automatic placement/wire routing tool in order that the BC block 123 is located adjacent to the CPU data path part 131. The CPU data path part 131, the CPU control part 132 and the BC block 123 are laid out in one rectangular block, wherein the CPU data path part 131 is dealt with as a core part while CPU control part 132 and the BC block 123 are dealt with as a peripheral part. An unused layer of the BC block 123 is used to form an over-through interconnection 130 between the CPU data path 131 and the RAM block 125. The use of the over-through interconnection 130 makes it possible to equally shorten the path length between the CPU data path part 131 and the RAM block 125, whereby signal timing therebetween can be optimized. Additionally, the CPU data path part 131 and the RAM block 125 can be connected with each other in linear fashion. High performance can be maintained, and reduction of the area can be achieved.

In each of the above-described examples, layout data about one core component and respective logical data about a plurality of peripheral components are reused for the layout design of a new LSI. Instead of reusing logical data about a certain peripheral component, functional data about the peripheral component may be reused. In such a case it becomes possible to optimize the timing of peripheral component corresponding to the layout data of the core component.

Additionally, logical data about one core component and respective functional data about a plurality of peripheral components may be reused to layout design a new LSI. In such a case, not only the form of a peripheral part of the new LSI but also the form of a core part thereof can freely be changed, and the timing design of peripheral component can be performed with improved flexibility.

FIG. 7A depicts an example of a predesigned microcontroller. FIG. 7B shows an example of a new microcontroller generated by resource reusing design. A predesigned microcontroller 140, shown in FIG. 7A, is composed of three circuit blocks, namely a CPU block 141, a RAM block 142 and a circuit block 143 having other peripheral functions. The CPU block 141 is made up of a CPU data path part 141*a* and a CPU control part 141*b*. The RAM block 142 is made up of a plurality of memory cells 142*a* and a plurality of memory control parts 142*b* for controlling the operation of the memory cells 142*a*. The new microcontroller 160 of FIG. 7B is generated by layout design in which (a) the CPU data path part 141*a* is a first core part 151, (b) the memory cells 142*a* are a second core part 152, (c) the CPU control part 141*b*, the memory control parts 142*b* and the circuit block 143 are a peripheral part 153, and (d) the storage capacity of the RAM block 142 is changed. Layout data about the first core part 151 of the predesigned microcontroller 140 (i.e., the CPU data path part 141*a*) is reused as is, as layout data about a CPU data path part 161*a* forming a first core part 171 of the new microcontroller 160. Additionally, layout data about the second core part 152 of the predesigned microcontroller 140 (i.e., the memory cells 142*a*) is partially deleted and then reused as layout data about memory cells 162*a* forming a second core part 172 of the new microcontroller 160. Further, respective logical or functional data about the CPU control part 141*b*, the memory control parts 142*b* and the circuit block 143, which together form the peripheral part 153 of the predesigned microcontroller 140, are used to layout design a circuit block 163 which forms a peripheral part 173 of the new microcontroller 160 and which has control functions and other functions. In this case, a section of the circuit block 163 for memory control is reduced to the storage capacity of the memory cells 162*a*. Layout data about the entire new microcontroller 160 is obtained by the assembling of layout data about the circuit block 161*a*, layout data about the circuit block 162*a* and layout data about the circuit block 163. X1 and X2 of FIG. 7B are rectangular blocks which are obtained by peripheral part division/merge processing and which together form the L-shaped peripheral part 173 of the new microcontroller 160.

Figure 8A:
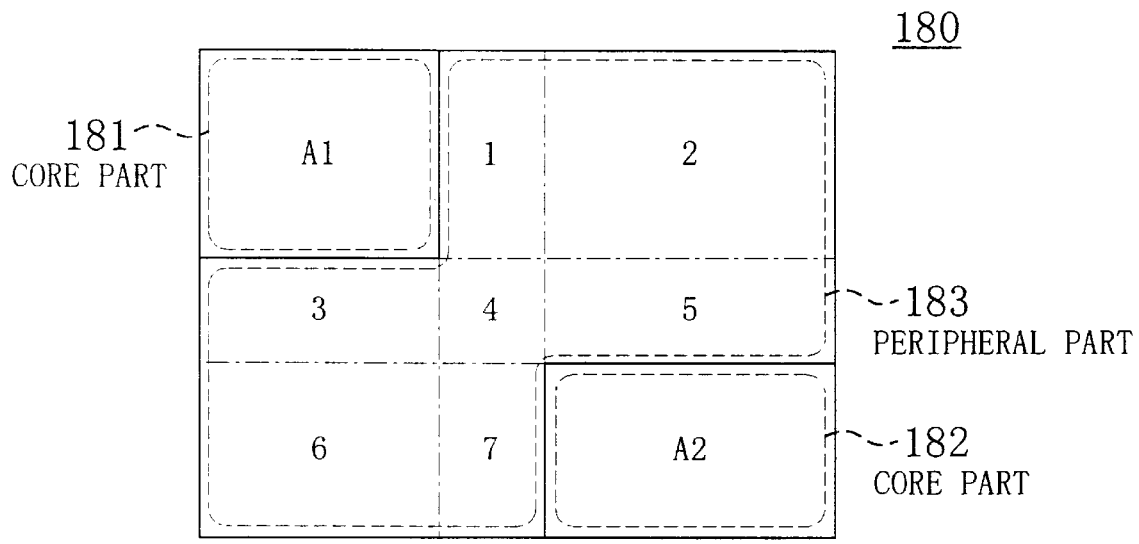
FIGS. 8A and 8B are diagrams which explain the operation of the peripheral part division/merge unit of FIG. 1 when a design-target LSI has a plurality of core parts.
Figure 8B:
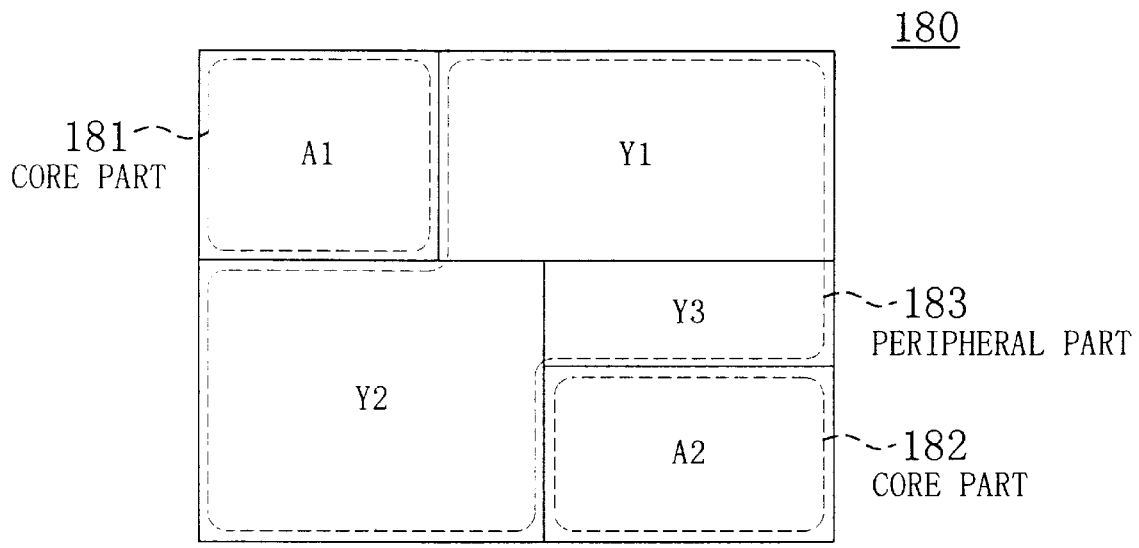

FIGS. 8A and 8B show the operation of the PPDMU (peripheral part division/merge unit) 15 when a design-target LSI has a plurality of core parts. An LSI 180, shown in FIG. 8A, has two core parts 181 and 182. The entire geometric form of the LSI 180 is determined according to given circuit information. Both the location of a first circuit block A1 forming the core part 181 and the location of a second circuit block A2 forming the core part 182 are determined. Two parting lines are drawn from the vertex of the first circuit block A1 such that the parting lines run into outlines of the LSI 180 or into outlines of the second circuit block A2. Additionally, two parting lines are drawn from the vertex of the second circuit block A2 such that the parting lines run into outlines of the LSI 180 or into outlines of the first circuit block A1. The area of a peripheral part 183 of the LSI is divided into seven rectangular block zones. In this example shown in FIG. 8B, the zones 1 and 2 are merged to form a rectangular block Y1, and the zones 3, 4, 6 and 7 are merged to form a rectangular block Y2. The zone 5 simply becomes a rectangular block Y3. As a result, the size (dimensions) of each of the three rectangular blocks Y1, Y2 and Y3 together forming the peripheral part 183, is determined. Based on the result of this determination, peripheral circuit blocks allocation is executed.

Figure 9:
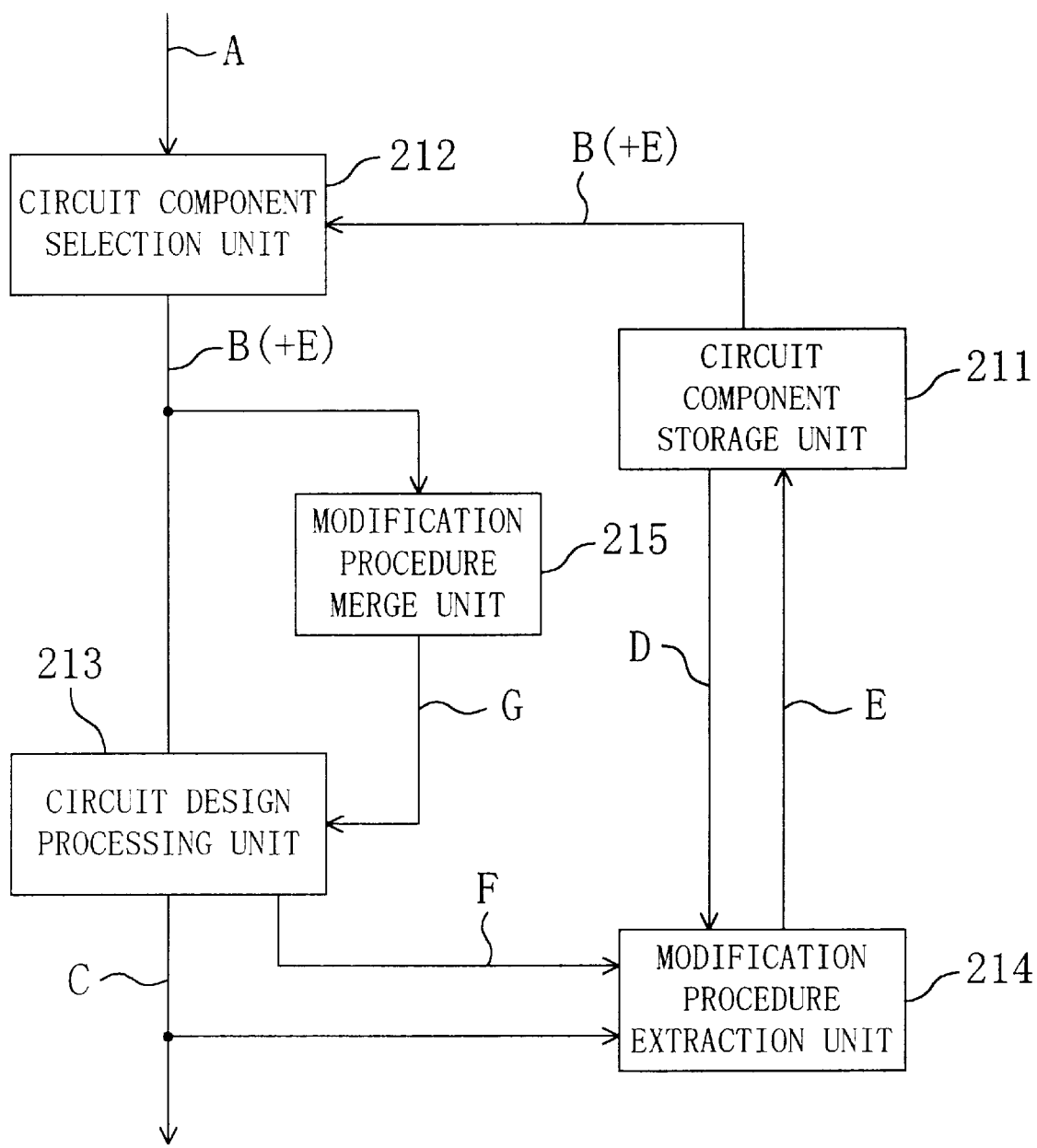
FIG. 9 shows in block form another example of an LSI automated design system for the realization of resource reusing design in accordance with the present invention.

With reference to FIG. 9, another example of the structure of an LSI automated design system according to the present invention is illustrated. 211 is a circuit component storage unit. 212 is a circuit component selection unit. 213 is a circuit design processing unit. 214 is a modification procedure extraction unit. 215 is a modification procedure merge unit.

The storage unit 211 is a library that stores circuit data about a standard LSI, circuit data about at least one core component and circuit data about a plurality of peripheral components. The selection unit 212 reads, based on CIRCUIT CONFIGURATION INFORMATION A about a design-target LSI, CIRCUIT DATA B about necessary components from the storage unit 211. The processing unit 213 generates, from CIRCUIT DATA B read, CIRCUIT DATA C about the design-target LSI. At this time, modification processing, which is necessary for the connecting of the individual peripheral components with the core component, is performed on core component circuit data, according to modification operations by a human designer with the aid of a text editor. Further, with the modified core component circuit data and each peripheral component circuit data, design processing is performed for the connecting of the core component and each of the peripheral components. As a result of such design processing, CIRCUIT DATA C about the design-target LSI is obtained. The generated CIRCUIT DATA C contains therein the modified core component circuit data, the circuit data about the individual peripheral components and interconnection information among these components. Note that CIRCUIT DATA B and C are either functional data, logical data or layout data.

The extraction unit 214 extracts MODIFICATION PROCEDURE INFORMATION E describing a procedure of modification processing applied to the core component circuit data for each peripheral component, by comparison between CIRCUIT DATA D about the standard LSI read out from the storage unit 211 and CIRCUIT DATA C about the LSI generated by the processing unit 213. Alternatively, the extraction unit 214 extracts MODIFICATION PROCEDURE INFO E for each peripheral component from OPERATION HISTORY F of the modification processing in the processing unit 213. The extracted MODIFICATION PROCEDURE INFO E is, together with circuit data about a corresponding peripheral component, stored in the storage unit 211.

The above-described operations are performed repeatedly, whereby MODIFICATION PROCEDURE INFO E concerning various core component/peripheral component combinations is accumulated in the storage unit 211 as design assets for future use.

When CIRCUIT CONFIGURATION INFORMATION A about a specific design-target LSI is fed to the selection unit 212, the storage unit 211 provides CIRCUIT DATA B about a necessary component together with MODIFICATION PROCEDURE INFO E. The merge unit 215 generates, from MODIFICATION PROCEDURE INFO E for each peripheral component, MODIFICATION PROCEDURE INFORMATION G merged, for the connecting of the necessary peripheral components with a core component. MODIFICATION PROCEDURE INFO G is fed to the processing unit 213. The processing unit 213 generates, from CIRCUIT DATA B read out from the storage unit 211 for each component and from MODIFICATION PROCEDURE INFO G generated, CIRCUIT DATA C about the design-target LSI. At this time, modification processing necessary for the connecting of the necessary peripheral components with the core component is performed on the core component circuit data on the basis of the merged MODIFICATION PROCEDURE INFO G.

A design example of a microcontroller LSI is described below. For convenience, suppose here that a microcontroller is made up of a CPU (central processing unit) functioning as a core component and two peripheral components. One of the two peripheral components may be an FPU (floating point arithmetic unit) and the other may be a ULC (user logical circuit).

Figure 10:
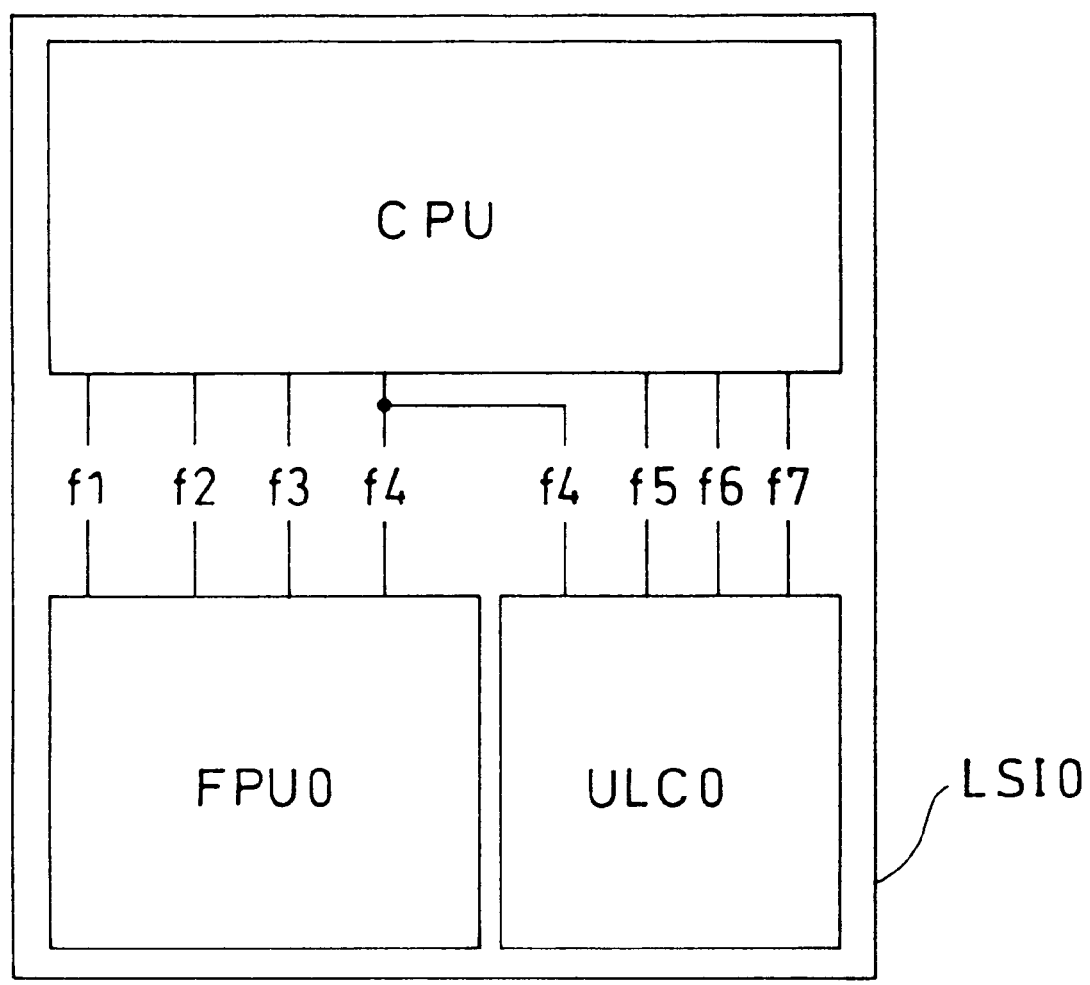
FIG. 10 shows an example of the internal structure of a standard predesigned LSI.

FIG. 10 illustrates an internal structure example of a predesigned microcontroller (hereinafter called the LSI0). The LSI0 comprises one CPU, one specific FPU (FPU0) and one specific ULC (ULC0). In the figure, fi (i=from 1 to 7) indicates a terminal for component-to-component connection. The CPU is provided with seven terminals f1–7. The FPU0 is provided with four terminals f1–f4. The ULC0 is provided with four terminals f4–7. The description of internal modules corresponding to the individual terminals is not made here.

FIGS. 11A–H show examples of circuit components stored in the storage unit 211 of FIG. 9. Like circuit data about each component 232–238, CIRCUIT DATA D about the LSI0, shown in a component 231 of FIG. 11A, is stored in the storage unit 211. CIRCUIT DATA D contains circuit data about the CPU, circuit data about the FPU0, circuit data about the ULC0 and information about interconnections among these components. FIG. 11B shows CIRCUIT DATA B1 about the CPU. FIG. 11C shows CIRCUIT DATA B20 about the FPU0. FIG. 11F shows CIRCUIT DATA B30 about the ULC0. CIRCUIT DATA B1 indicates that the CPU has seven terminals (f1–7). CIRCUIT DATA B20 indicates that the FPU0 has four terminals (f1–4). CIRCUIT DATA B30 indicates that the ULC0 has four terminals (f4–7). FIG. 11D shows CIRCUIT DATA B21 about a floating point arithmetic unit (herein after called the FPU1) that is a first substitute for the FPU0. FIG. 11E shows CIRCUIT DATA B22 about a floating point arithmetic unit (herein after called the FPU2) that is a second substitute for the FPU0. FIG. 11G shows CIRCUIT DATA B31 about a user logic circuit (herein after called the ULC1) that is a first substitute for the ULC0. FIG. 11H shows CIRCUIT DATA B32 about a user logic circuit (herein after called the ULC2) that is a second substitute for the ULC0. CIRCUIT DATA B21 indicates that the FPU1 has four terminals (f1, g2, f3, g4). CIRCUIT DATA B22 indicates that the FPU2 has three terminals (f1, f2, g3). CIRCUIT DATA B31 indicates that the ULC1 has four terminals (g4, f5, g6, f7). CIRCUIT DATA B32 indicates that the ULC2 has four terminals (f4, f5, f6, g7).

Figure 12:
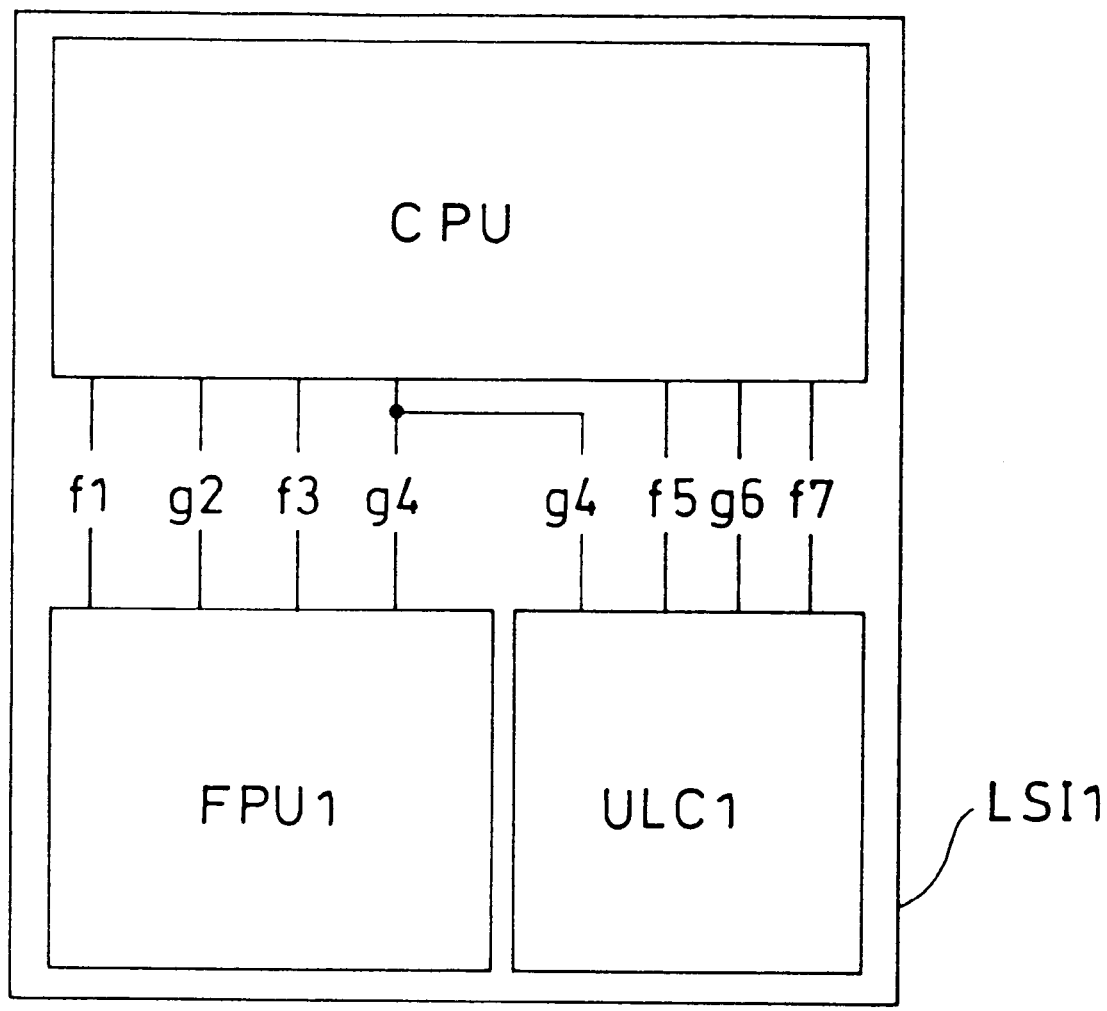
FIG. 12 shows an example of the internal structure of a first design-target LSI.

FIG. 12 illustrates an internal structure example of a first design-target microcontroller (herein after called the LSI1). The LSI1 comprises a CPU, an FPU1 and a ULC1. From FIG. 12, CIRCUIT DATA B1 of FIG. 11B must be modified in order that the CPU comes to have seven terminals f1, g2, f3, g4, f5, g6 and f7 corresponding to the FPU1 and ULC1.

The selection unit 212 of FIG. 9 receives circuit configuration information showing that the LSI1 is made up of the CPU, the FPU1 and the ULC1. Based on the received circuit configuration information, the selection unit 212 acquires CIRCUIT DATA B1 about the CPU, CIRCUIT DATA B21 about the FPU1 and CIRCUIT DATA B31 about the ULC1, from the storage unit 211. The processing unit 213 generates circuit data about the LSI1 from these circuit data B1, B21 and B31. At this time, modification processing necessary for the connecting of the FPU1 in place of the FPU0 with the CPU is applied to CIRCUIT DATA B1 of the CPU. The contents of this modification processing is the adding of terminals g2 and g4 to the CPU and the deleting of terminals f2 and f4 from the CPU. Further, modification processing necessary for the connecting of the ULC1 in place of the ULC0 with the CPU is applied to the CPU circuit data. The contents of this modification processing is the adding of terminals g4 and g6 to the CPU and the deleting of the terminals f4 and f6 from the CPU. The circuit data thus modified represents that the CPU has seven terminals f1, g2, f3, g4, f5, g6 and f7. Further, the post-modification CPU circuit data, the FPU1 circuit data B21 and the ULC1 circuit data B31 are used to perform design processing for the connecting of the CPU, the FPU1 and the ULC1, as a result of which circuit data for the LSI1 is obtained. The extraction unit 214 extracts modification procedure information indicative of a procedure of modification processing applied to the CPU circuit data B1 for each peripheral component, by comparison between CIRCUIT DATA D about the LSI0 of the storage unit 211 and the circuit data about the LSI1 generated by the processing unit 213. The extracted modification procedure information is, together with circuit data about a corresponding peripheral component, stored in the storage unit 211.

FIG. 13A shows modification procedure information E21 that is stored in the storage unit 211 together with CIRCUIT DATA B21. FIG. 13B shows modification procedure information E31 that is stored in the storage unit 211 together with CIRCUIT DATA B31. MODIFICATION PROCEDURE INFO E21, which is related to CIRCUIT DATA B21 (i.e., "add g2, add g4, delete f2, delete f4"), indicates that, for the connecting of the FPU1 in place of the FPU0 with the CPU, modification processing, which includes adding terminals g2 and g4 to the CPU and deleting terminals f2 and f4 from the CPU, is required. MODIFICATION PROCEDURE INFO E31, which is related to CIRCUIT DATA B31 (i.e., "add g4, add g6, delete f4, delete f6"), indicates that, for the connecting of the ULC1 in place of the ULC0 with the CPU, modification processing, which includes adding terminals g4 and g6 to the CPU and deleting terminals f4 and f6 from the CPU, is required. The component 234 of FIG. 11D is replaced with the component 251 of FIG. 13A, and the component 237 of FIG. 11G is replaced with the component 252 of FIG. 13B.

Figure 14:
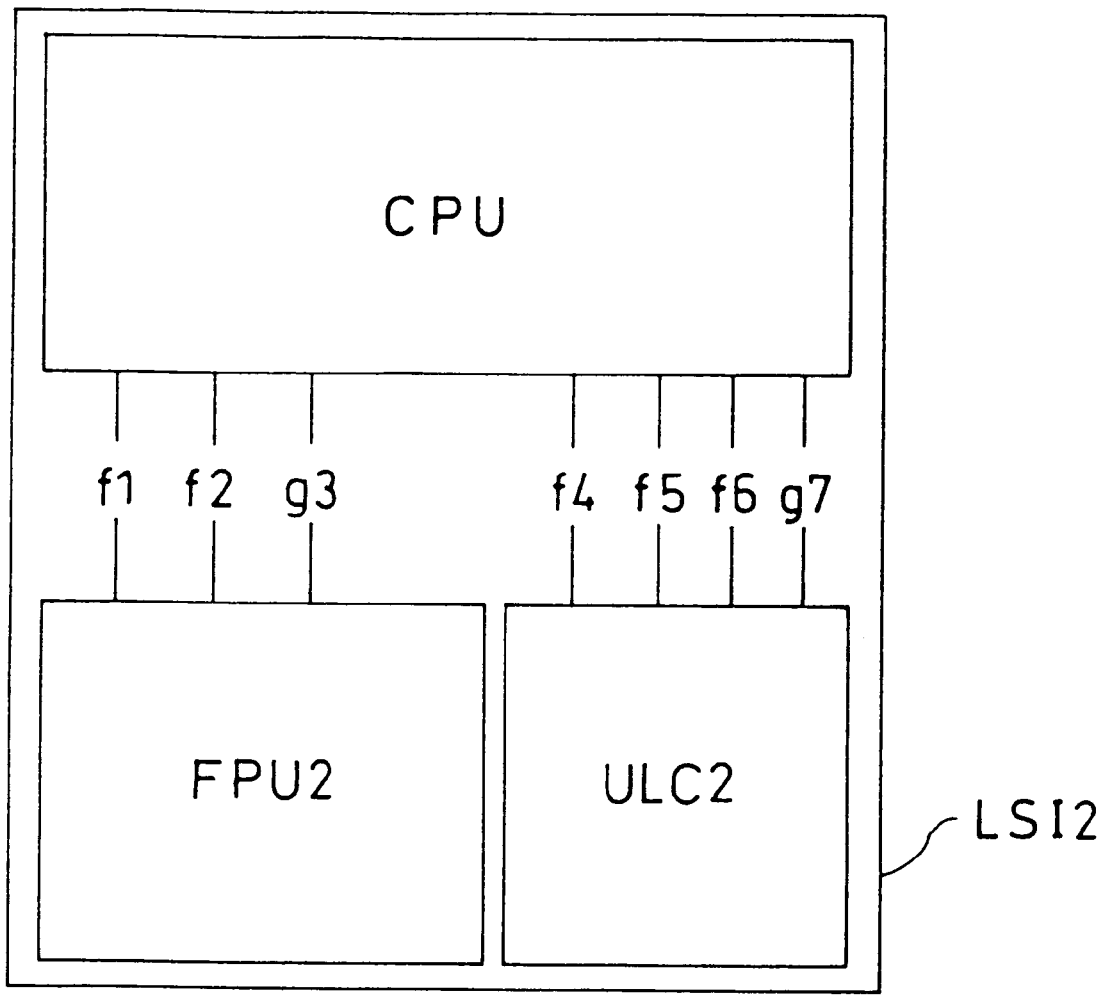
FIG. 14 shows an example of the internal structure of a second design-target LSI.

FIG. 14 illustrates an internal structure example of a second design-target microcontroller (herein after called the LSI2). The LSI2 is made up of a CPU, an FPU2 and a ULC2. Like the LSI1, circuit data about the LSI2 is generated, and modification procedure information, which is indicative of a procedure of modification processing applied to CIRCUIT DATA B1 about the CPU, is extracted for each component, and the extracted modification procedure information is stored in the circuit component storage unit 211, in the system shown in FIG. 9.

FIG. 15A shows modification procedure information E22 that is stored together with CIRCUIT DATA B22 in the storage unit 211. FIG. 15B shows modification procedure information E32 that is stored together with CIRCUIT DATA B32 in the storage unit 211. MODIFICATION PROCEDURE INFO E22, which is related to CIRCUIT DATA B22 (i.e., "add g3, delete f3, delete f4"), indicates that, for the connecting of the FPU2 in place of the FPU0 with the CPU, modification processing, which includes adding a terminal g3 to the CPU and deleting terminals f3 and f4 from the CPU, is required. MODIFICATION PROCEDURE INFO E32, which is related to CIRCUIT DATA B32 (i.e., "add g7, delete f7"), indicates that, for the connecting of the ULC2 in place of the ULC0 with the CPU, modification processing, which includes adding a terminal g7 to the CPU and deleting a terminal f7 from the CPU, is required. The component 235 of FIG. 11E is replaced with the component 271 of FIG. 15A, and the component 238 of FIG. 11H is replaced with the component 272 of FIG. 15B.

Figure 16:
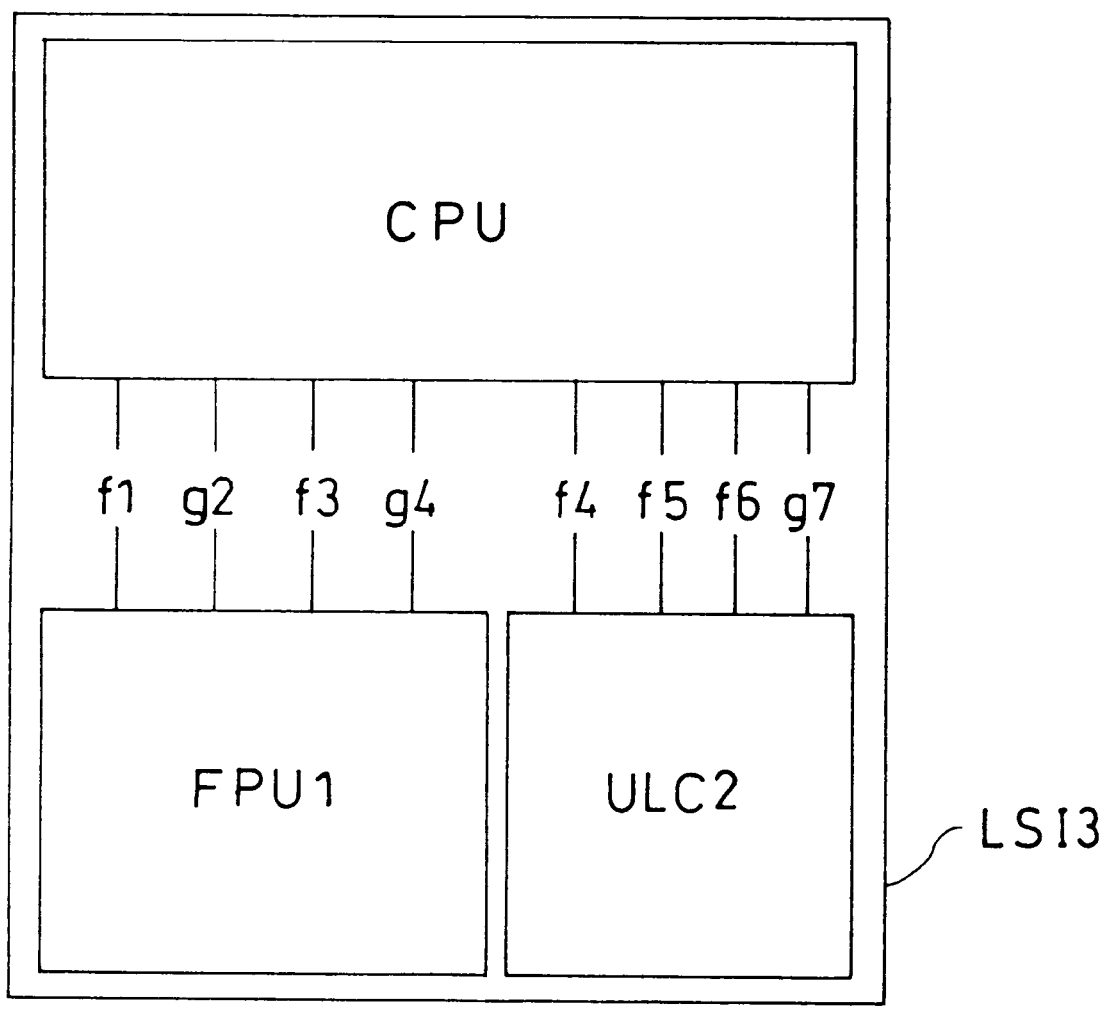
FIG. 16 shows an example of the internal structure of a third design-target LSI.

FIG. 16 illustrates an internal structure example of a third design-target microcontroller (hereinafter called the LSI3). The LSI3 comprises a CPU, an FPU1 and a ULC2.

The selection unit 212 of FIG. 9 receives circuit configuration information showing that the LSI3 is made up of the CPU, the FPU1 and the ULC2. Based on the received circuit configuration information, the selection unit 212 acquires (a) CIRCUIT DATA B1 about the CPU, (b) CIRCUIT DATA B21 about the FPU1, (c) MODIFICATION PROCEDURE INFO E21 related to CIRCUIT DATA B21, (d) CIRCUIT DATA B32 about the ULC2 and (e) MODIFICATION PROCEDURE INFO E32 related to CIRCUIT DATA B32, from the storage unit 211. The merge unit 215 generates, from MODIFICATION PROCEDURE INFO E21 and E32, merged modification procedure information for the connecting of the FPU1 and ULC2 with the CPU. The merged modification procedure information is fed to the processing unit 213.

FIG. 17 shows data that is fed from the merge unit 215 to the processing unit 213 at the time of the design of the LSI3. MERGED MODIFICATION PROCEDURE INFORMATION G3 contained in data 291 of FIG. 17 (i.e., "add g2, add g4, add g7, delete f2, delete f7"), indicates that, for the connecting of the ULC2 in place of the ULC0 with the CPU, modification processing, which includes adding terminals g2, g4 and g7 to the CPU and deleting terminals f2 and f7 from the CPU, is required. Of MERGED MODIFICATION PROCEDURE INFO G3, the terminal addition information of "add g2, add g4, add g7" is the OR of the terminal addition information of "add g2, add g4" of INFO E21 and the terminal addition information of "add g7" of INFO E32. Of INFO G3, the terminal deletion information of "delete f2, delete f7" is the OR of (a) the AND of the terminal deletion information of "delete f2, delete f4" of INFO E21 and CIRCUIT DATA B32 (f4, f5, f6, g7) and (b) the AND of the terminal deletion information of "delete f7" of INFO E32 and CIRCUIT DATA B21 (f1, g2, f3, g4). The terminals f2 and f7 are deleted since they are not used in any of the FPU1 and the ULC2. The terminal f4, although it is not used in the FPUL, is not deleted since it is used in the ULC2.

The processing unit 213 performs, based on MERGED MODIFICATION PROCEDURE INFO G3 from the merge unit 251, modification processing on CPU CIRCUIT DATA B21 and generates circuit data for the LSI3 by making use of the post-modification circuit data about the CPU, CIRCUIT DATA B21 about the FPU1 and CIRCUIT DATA B32 about the ULC2.

As described above, in accordance with the LSI automated design method using the system of FIG. 9, it is no longer necessary to reserve modified circuit data about the core component in the storage unit 211, thereby reducing the size of library. Additionally, modification procedure information about each peripheral component is reserved without changing the circuit data B1 about the core component stored in the storage unit 211, thereby allowing two designers to design the LSI1 of FIG. 12 and the LSI2 of FIG. 14, respectively, at the same time. Results concerning the modification of the core component circuit data in the design of the LSI1 and LSI2 can be reused easily. For the case of reusing layout data about a core component, by changing the connection of a terminal of the core component, to a ground interconnection line or to a power supply interconnection line the terminal can be deleted without having to change the geometric form of the core component. On the other hand, it is possible to add terminals to a core component.

FIG. 18 shows an example of an operation history in the processing unit 213 of FIG. 9. 293 of FIG. 18 shows a part of a log file of a text editor which was used by a designer to modify circuit data about a CPU for the connecting of a ULC1 with a CPU. FIG. 18 shows a manner of "repeated trial and error" at the operation time. The log file 293 is fed to the extraction unit 214.

FIG. 19 shows data that is generated by the extraction unit 241 on the basis of the log file 293 of FIG. 18. The data 295 of FIG. 19 has terminal addition information on line 200 and terminal deletion information on line 201. Whereas the terminal addition information (line 200) is generated on the basis of lines 100 and 101 of FIG. 18, the terminal deletion information (line 201) is generated on the basis of lines 102, 103 and 104 of FIG. 18. The data 295 of FIG. 19 contains modification procedure information extracted from the log file 293. The terminal addition and deletion information of the data 295 corresponds to a part of MODIFICATION PROCEDURE INFO E31 shown in FIG. 13B.

For the case of designing a microcontroller that is formed of a CPU, an FPU2 and a ULC1, CIRCUIT DATA B1 about the CPU, CIRCUIT DATA B22 about the FPU2, MODIFICATION PROCEDURE INFO E22 related to CIRCUIT DATA B22, CIRCUIT DATA B31 about the ULC1 and MODIFICATION PROCEDURE INFO E31 related to CIRCUIT DATA B31 stored in the storage unit 211 are reused, and modification procedure information as a result of merging INFO E22 and INFO E31 is fed to the processing unit 213.

For the case of designing a microcontroller that is formed of a CPU, an FPU0 and a ULC1, CIRCUIT DATA B1 about the CPU, CIRCUIT DATA B20 about the FPU0, CIRCUIT DATA B31 about the ULC1 and MODIFICATION PROCEDURE INFO E31 related to CIRCUIT DATA B31 stored in the storage unit 211 are reused. At this time, modification procedure information related to CIRCUIT DATA B20 is dealt with as an empty set in the merge unit 215.

The invention claimed is:

1. A method for automatically designing a layout for a semiconductor integrated circuit from circuit data stored in a storage unit, said method comprising the steps of:

(a) reading circuit data about a core component necessary for said semiconductor integrated circuit, and circuit data about a peripheral component necessary for said semiconductor integrated circuit;

(b) receiving circuit information about an entire geometric form of said semiconductor integrated circuit and a placement of circuit blocks of said semiconductor integrated circuit;

(c) modifying said peripheral component circuit data according to said circuit information;

(d) generating, from said modified peripheral component circuit data, layout data about said peripheral component of said semiconductor integrated circuit; and (e) generating, from said peripheral component layout data generated and said core component circuit data, layout data about the entirety of said semiconductor integrated circuit, said core component circuit data and said peripheral component circuit data representing different levels of circuit design data.

2. A method as in claim 1 wherein said step (c) includes dividing and merging said peripheral component circuit data read out from said storage unit, according to said circuit information.

3. A method as in claim 1 further comprising the steps of:

selecting layout data as said core component circuit data that is read out from said storage unit; and selecting either logical data or functional data as said peripheral component circuit data that is read out from said storage unit.

4. A method as in claim 1 further comprising the steps of:

selecting logical data as said core component circuit data that is read out from said storage unit; and selecting functional data as said peripheral component circuit data that is read out from said storage unit.

5. A method as in claim 1 further comprising the steps of:

selecting layout data as circuit data for some of blocks of said core component which are read out from said storage unit; and selecting logical data or functional data as circuit data for the remaining blocks of said core component which are read out from said storage unit.

6. A method as in claim 5 further comprising the steps of:

modifying either said logical data or said functional data; and generating layout data either from said logical data modified or from said functional data modified.

7. A method as in claim 1 further comprising the steps of:

placing and wiring a block of said peripheral component located adjacent to said core component so that at least one of layers of said adjacent block remains unused; and establishing an over-through interconnection to said core component by making use of said unused layer.

8. A method for automatically designing a semiconductor integrated circuit from circuit data stored in a storage unit, said method comprising the steps of:

(a) from said storage unit, reading:

circuit data about a core component necessary for said semiconductor integrated circuit;

circuit data about a first peripheral component necessary for said semiconductor integrated circuit;

circuit data about a second peripheral component necessary for said semiconductor integrated circuit;

first modification procedure information which describes a procedure of modification processing to be applied to said core component circuit data for the connecting of said first peripheral component with said core component; and second modification procedure information which describes a procedure of modification processing to be applied to said core component circuit data for the connecting of said second peripheral component with said core component;

(b) finding, by merging said first modification procedure information and said second modification procedure information, third modification procedure information to be applied to said core component circuit data for the connecting of said first and second peripheral components with said core component;

(c) performing modification processing on the basis of said third modification procedure information, on said core component circuit data; and (d) by making use of said core component circuit data modified, said first peripheral component circuit data read and said second peripheral component circuit data read, generating circuit data about said semiconductor integrated circuit.

9. A method as in claim 8 including the steps of:

reading said core component circuit data from said storage unit;

performing modification processing necessary for the connecting of said first peripheral component with said core component on said core component circuit data read;

extracting, from said modification processing, procedure information regarding said modification processing; and storing said procedure information extracted in said storage unit as said first modification procedure information.

10. A method as in claim 9 further including the step of storing, in said storage unit, said first modification procedure information in a manner related with said first peripheral component circuit data.

11. A method as in claim 8 including the steps of:

reading said core component circuit data from said storage unit;

performing modification processing necessary for the connecting of said second peripheral component with said core component on said core component circuit data read;

extracting, from said modification processing, procedure information regarding said modification processing; and storing said procedure information extracted in said storage unit as said second modification procedure information.

12. A method as in claim 11 further including the step of storing, in said storage unit, said second modification procedure information in a manner related with said second peripheral component circuit data.

13. A method as in claim 8, wherein:

(a) said first modification procedure information includes:

first subinformation which describes a partial configuration to be added to said core component for the connecting of said first peripheral component with said core component; and second subinformation which describes a partial configuration that becomes unnecessary for the connecting of said first peripheral component with said core component;
(b) said second modification procedure information includes:
third subinformation which describes a partial configuration to be added to said core component for the connecting of said second peripheral component with said core component; and
fourth subinformation which describes a partial configuration that becomes unnecessary for the connecting of said second peripheral component with said core component; and
(c) said step (b) of finding said third modification procedure information includes the steps of:
selecting information which contains fifth subinformation and sixth subinformation as said third modification procedure information;

said fifth subinformation representing a partial configuration that is contained in at least one of said first subinformation and said second subinformation, as a partial configuration to be added to said core component for the connecting of said first and second peripheral components with said core component;
said sixth subinformation representing a partial configuration that is contained in said second subinformation but not in said second peripheral component circuit data and a partial configuration that is contained in said fourth subinformation but not in said first peripheral component circuit data, as a partial configuration which becomes unnecessary for the connecting of said first and second peripheral components with said core component.

* * * * *